United States Patent
Shin et al.

(10) Patent No.: US 7,148,530 B2
(45) Date of Patent: Dec. 12, 2006

(54) FERROELECTRIC CAPACITOR AND METHOD FOR MANUFACTURING THE SAME

(75) Inventors: Sang-min Shin, Seongnam (KR); Yong-kyun Lee, Yongin (KR); Bo-soo Kang, Seoul (KR); Tae-won Noh, Seoul (KR); Jong-gul Yoon, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 44 days.

(21) Appl. No.: 10/770,471

(22) Filed: Feb. 4, 2004

(65) Prior Publication Data

US 2004/0155272 A1 Aug. 12, 2004

(30) Foreign Application Priority Data

Feb. 4, 2003 (KR) .................. 10-2003-0006728

(51) Int. Cl.
*H01L 27/112* (2006.01)
(52) U.S. Cl. .................. 257/295; 257/E27.048; 257/E27.104; 438/3
(58) Field of Classification Search .......... 257/295, 257/E27.048, E27.084, E27.104, E29.164, 257/E29.272, E29.342–E29.343, E21.663–E21.664, 257/E21.208; 438/3; 365/145; 501/134
See application file for complete search history.

(56) References Cited

U.S. PATENT DOCUMENTS

| | | | | |
|---|---|---|---|---|
| 5,519,234 A | * | 5/1996 | Paz de Araujo et al. .... | 257/295 |
| 5,527,567 A | * | 6/1996 | Desu et al. .................. | 427/573 |
| 5,736,759 A | * | 4/1998 | Haushalter ................... | 257/295 |
| 5,998,236 A | * | 12/1999 | Roeder et al. ............. | 438/104 |
| 6,090,443 A | * | 7/2000 | Eastep .................... | 427/255.32 |
| 6,153,898 A | * | 11/2000 | Watanabe et al. ........... | 257/295 |
| 6,194,227 B1 | * | 2/2001 | Hase ............................. | 438/3 |
| 6,229,166 B1 | * | 5/2001 | Kim et al. ................... | 257/295 |
| 6,232,167 B1 | * | 5/2001 | Satoh et al. ................ | 438/240 |
| 6,258,459 B1 | * | 7/2001 | Noguchi et al. ............ | 428/446 |
| 6,841,817 B1 | * | 1/2005 | Kurasawa et al. .......... | 257/295 |
| 2002/0035961 A1 | * | 3/2002 | Natori et al. ................. | 117/54 |
| 2002/0074601 A1 | * | 6/2002 | Fox et al. .................... | 257/350 |

* cited by examiner

*Primary Examiner*—Allan R. Wilson
(74) *Attorney, Agent, or Firm*—Lee & Morse, P.C.

(57) ABSTRACT

A ferroelectric capacitor and a method for manufacturing the same includes a lower electrode, a dielectric layer, and an upper electrode layer, which are sequentially stacked, wherein the dielectric layer has a multi-layer structure including a plurality of sequentially stacked ferroelectric films, and wherein two adjacent ferroelectric films have either different compositions or different composition ratios. Use of a ferroelectric capacitor according to an embodiment of the present invention, it is possible to hold stable polarization states of ferroelectric domains for a long retention time, and thus data written in the ferroelectric capacitor a long time ago can be accurately written, thereby improving the reliability of a ferroelectric random access memory (FRAM).

25 Claims, 5 Drawing Sheets

$$\Delta P_{os} = P^*_{os} - P\hat{}_{os}$$

FIG. 9

FERROELECTRIC CAPACITOR AND METHOD FOR MANUFACTURING THE SAME

BACKGROUND OF THE INVENTION

1. Field of the Invention

The present invention relates to a capacitor of a semiconductor memory device and a method for manufacturing the same. More particularly, the present invention relates to a ferroelectric capacitor including at least two ferroelectric films having different compositions or different composition ratios and a method for manufacturing the same.

2. Description of the Related Art

Wide use of portable electronic devices, such as mobile information and communication devices, has increased demand for a non-volatile memory that retains data even after the power is turned off. It is anticipated that a ferroelectric random access memory (FRAM) will be a non-volatile memory having benefits of high-speed data processing and low power consumption.

In general, a semiconductor memory device includes a plurality of memory cells, wherein each memory cell includes a transistor and a capacitor. Similarly, each memory cell of a FRAM also includes a transistor and a capacitor. However, a capacitor in a FRAM is a ferroelectric capacitor that uses a ferroelectric substance as a dielectric material.

Figure 1:
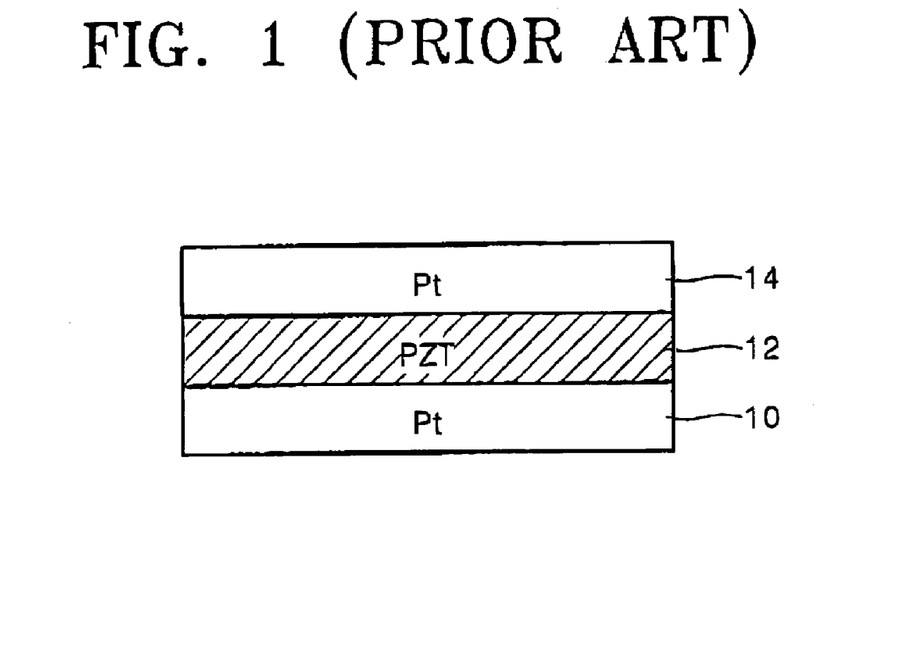
FIGS. 1 and 2 illustrate cross-sectional diagrams of the structure of a first and a second conventional ferroelectric capacitor.

As shown in FIG. 1, a conventional ferroelectric capacitor is formed by sequentially stacking a first platinum (Pt) film 10 as a lower electrode, a PZT ($PbZr_xTi_{1-x}O_3$) film 12 as a ferroelectric film, and a second platinum (Pt) film 14 as an upper electrode.

In the conventional ferroelectric capacitor of FIG. 1, the PZT film 12 is formed having a predetermined thickness using a chemical solution deposition (CSD) or a chemical vapor deposition (CVD).

During formation of this conventional ferroelectric capacitor, defects, such as voids or excess atoms, are formed in an interfacial area of the PZT film 12. Such defects remain in the ferroelectric capacitor even after the PZT film 12 is reheated, which causes the degradation of the FRAM, and in particular, a degradation of the retention characteristics of the FRAM. The retention characteristics and the measurement thereof will be described later.

In an attempt to solve the above problem, a recent study introduced a ferroelectric capacitor in which upper and lower electrodes are replaced with oxide substances, such as $IrO_2$, $RuO_2$, $SrRuO_3$, or the like, to compensate for the leakage of oxygen. In addition, a platinum (Pt) film, which is useful for crystal formation of the PZT film 12, is used as an interlayer to improve the characteristics of the interfacial area of the PZT film 12.

Figure 2:
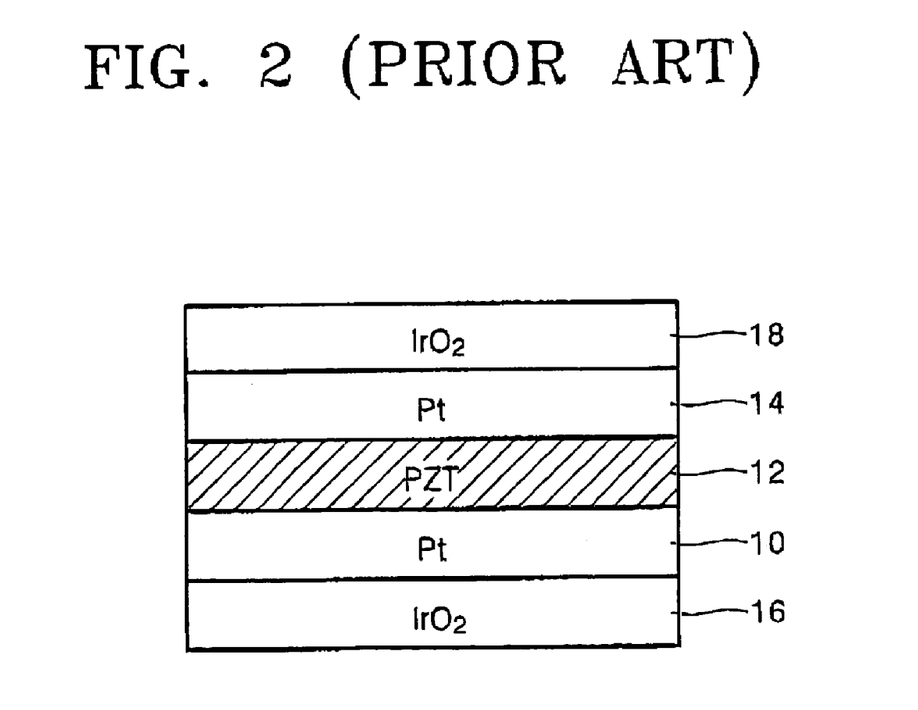

As shown in FIG. 2, such a ferroelectric capacitor includes the PZT film 12, a lower electrode formed under the PZT film 12 by sequentially stacking a first iridium oxide ($IrO_2$) film 16 and a first platinum (Pt) film 10, and an upper electrode formed on the PZT film 12 by sequentially stacking a second platinum (Pt) film 14 and a second iridium oxide ($IrO_2$) film 18.

In this arrangement, the first and second platinum (Pt) films 10 and 14 are used as first and second interlayers, respectively, but are described herein as an element of the upper and lower electrodes, respectively, for convenience of explanation.

The conventional ferroelectric capacitor of FIG. 2 has many advantages over the conventional ferroelectric capacitor of FIG. 1 but still has the above-described defects in the PZT film 12. The defects accumulate in the interfacial area of the PZT film 12 with electrical charges flowing from the upper and lower electrodes for a long retention time. In a capacitor where domains are arranged in one direction by applying a voltage to the capacitor, or in a capacitor heated for an acceleration test, the movement of the electrical charges or the inflow of the electrical charges from the outside exhibits a tendency to increase.

As a result, an electric field is induced in the PZT film 12 in a direction of an external electric field causing the polarization of the ferroelectric domains. The movement and accumulation of the electric charges continues which increases the strength of the electric field induced in the PZT film 12.

If the induced electric field exists in the PZT film 12 when the polarization directions of the ferroelectric domains are switched to the opposite direction by applying a voltage to the PZT film 12 after a predetermined time, new polarization states of the ferroelectric domains become unstable.

As described above, since conventional ferroelectric capacitors include an induced electric field in a PZT film due to defects of the PZT film, new polarization states of ferroelectric domains become unstable when the polarization direction of the ferroelectric domains is switched to the opposite direction by applying a voltage to the PZT film. Therefore, as the size of the ferroelectric capacitor decreases with the improvement of an integration density of the FRAM, the concentration of defects increases while several processes are processed. Accordingly, the polarization states of the domains of the PZT film become more unstable every time data is written. Thus, as the integration density increases, the reliability of the FRAM including such a conventional ferroelectric capacitor is degraded.

SUMMARY OF THE INVENTION

The present invention provides a ferroelectric capacitor capable of holding stable polarization states of ferroelectric domains for a long retention time, thereby assuring sufficient reliability of a ferroelectric random access memory (FRAM).

The present invention also provides a method for manufacturing the ferroelectric capacitor.

According to a feature of the present invention, there is provided a ferroelectric capacitor including a lower electrode, a dielectric layer, and an upper electrode layer, which are sequentially stacked, wherein the dielectric layer has a multi-layer structure including a plurality of sequentially stacked ferroelectric films, and wherein two adjacent ferroelectric films have either different compositions or different composition ratios.

The ferroelectric capacitor may further include an interlayer disposed in a position selected from the group consisting of between the lower electrode and the dielectric layer, between the upper electrode and the dielectric layer, and both between the lower electrode and the dielectric layer and the upper electrode and the dielectric layer. Preferably, the interlayer is a platinum (Pt) layer.

The dielectric layer may either include a first and a second sequentially stacked ferroelectric films or it may include first through third sequentially stacked ferroelectric films.

In an embodiment on the present invention, each of the ferroelectric films are formed of a material selected from the group consisting of a PZT film, a PLZT ($Pb_{1-z}La_zZr_xTi_{1-x}O_3$) film, and a BSO-PZT film, and wherein adjacent ferroelectric films are formed of a different material. In another embodiment of the present invention, each of the ferroelectric films are formed of a material selected from the group consisting of a PZT film, a PLZT ($Pb_{1-z}La_zZr_xTi_{1-x}O_3$) film, and a BSO-PZT film, and wherein adjacent ferroelectric films are formed of the same material but have different composition ratios.

The upper and lower electrodes may be formed of a single layer of either a metal, such as platinum (Pt) or iridium (Ir), or a conductive oxide, such as iridium oxide ($IrO_2$) or ruthenium oxide ($RuO_2$). Alternately, the upper and lower electrodes may be formed of a sequentially stacked metal layer and a conductive oxide layer.

According to another feature of the present invention, there is provided a method for manufacturing a ferroelectric capacitor in which a lower electrode, a dielectric layer, and an upper electrode layer are sequentially stacked, wherein the dielectric layer is formed by forming a first ferroelectric film on the lower electrode and forming a second ferroelectric film on the first ferroelectric film, wherein the second ferroelectric film has a different composition or a different composition ratio from the composition or composition ratio of the first ferroelectric film.

The method further includes forming a third ferroelectric film on the second ferroelectric film, wherein the third ferroelectric film has a different composition or a different composition ratio from the composition or composition ratio of the second ferroelectric film.

In an embodiment of the present invention, adjacent ferroelectric films are formed using different formation processes to have the same composition but different composition ratios. In another embodiment of the present invention, adjacent ferroelectric films are formed using the same formation process to have different compositions.

The ferroelectric films are formed of a material selected from the group consisting of a PZT film, a PLZT film, and a BSO-PZT film. The ferroelectric films are formed using either a chemical solution deposition (CSD), a metal organic chemical vapor deposition (MOCVD), or a combination of the two deposition processes.

The method may further include forming an interlayer between the lower electrode and the dielectric layer to facilitate the formation of the first ferroelectric film or between the upper electrode and the dielectric layer to facilitate the formation of the third ferroelectric film.

According to a ferroelectric capacitor of the present invention, since it is possible to prevent defects from moving in the ferroelectric capacitor by forming an interfacial area between two different ferroelectric films, electric fields in the ferroelectric films are greatly weakened, thereby making it possible to hold stable polarization states of the ferroelectric domains for a long retention time. Therefore, it is possible to accurately read data written in the ferroelectric capacitor a long time ago, thereby improving the reliability of the FRAM.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2003-6728, filed Feb. 4, 2003, and entitled: "Ferroelectric Capacitor and Method for Manufacturing the Same," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, ferroelectric capacitors according to a first and a second embodiment of the present invention will be described.

FIRST EMBODIMENT

A ferroelectric capacitor according to the first embodiment of the present invention is characterized by a dielectric layer formed of three ferroelectric films where adjacent ferroelectric films have either different compositions or different composition ratios.

Figure 3:
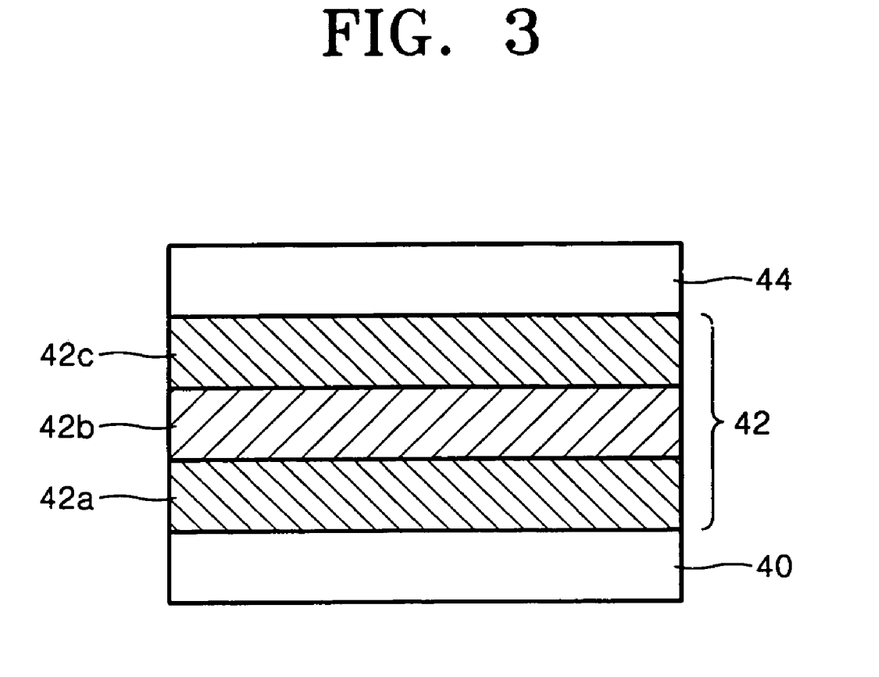
FIG. 3 illustrates a cross-sectional diagram of the structure of a ferroelectric capacitor according to a first embodiment of the present invention.

Referring to FIG. 3, a ferroelectric capacitor according to the first embodiment of the present invention includes a lower electrode 40, a dielectric layer 42, and an upper electrode 44. The dielectric layer 42 is formed by sequentially stacking first through third dielectric films 42a, 42b, and 42c on the lower electrode 40. The first dielectric film 42a is a predetermined ferroelectric film such as a PZT (PbZr$_X$Ti$_{1-X}$O$_3$) film, a PLZT (Pb$_{1-Z}$La$_Z$Zr$_X$Ti$_{1-X}$O$_3$) film, or a BSO-PZT (Bi$_2$SiO$_5$ additive PZT) film. Here, X and Z represent numbers within a valid range of 0–1. For example, if X is equal to 0.35, the distribution ratio of Zr to Ti is 35 to 65. The second dielectric film 42b is a predetermined ferroelectric film and may be a PZT film, a PLZT film, or a BSO-PZT film, but the second dielectric film 42b preferably is different from the first dielectric film 42a. The third dielectric film 42c is also a ferroelectric film and may be a PZT film, a PLZT film, or a BSO-PZT film, but the third dielectric film 42c is preferably different from the second dielectric film 42b.

If the first and the second dielectric films 42a and 42b are ferroelectric films having the same composition, for example, PZT films, then it is preferable that the composition ratio of a PZT film used as the first dielectric film 42a (hereinafter, referred to as a first PZT film) is different from that of a PZT film used as the second dielectric film 42b (hereinafter, referred to as a second PZT film). More specifically, in the molecular formulas of the first and the second PZT films, i.e., PbZr$_X$Ti$_{1-X}$O$_3$ and PbZr$_Y$Ti$_{1-Y}$O$_3$, it is preferable that the subscripts X and Y are different. This fact may be applied to a case where the first and the second dielectric films 42a and 42b are PLZT films.

The relationship between the second and the third dielectric films 42b and 42c is the same as the relationship between the first and the second dielectric films 42a and 42b.

Preferably, the third dielectric film 42c is a ferroelectric film such as a PZT film, a PLZT film, or a BSO-PZT film. However, it is preferable that the third dielectric film 42c is a ferroelectric film having either a different composition or different composition ratio from that of the second dielectric film 42b. Therefore, if the second dielectric film 42b is a PZT film having a predetermined thickness, it is preferable that the third dielectric film 42c be a PLZT film, a BSO-PZT film, or another ferroelectric film having a predetermined thickness. If the second and the third dielectric films 42b and 42c are ferroelectric films having the same composition, it is preferable that the second and the third dielectric films 42b and 42c have different composition ratios. Preferably, the first through third dielectric films 42a, 42b, and 42c have a thickness of 3 nm–50 nm, 30 nm–150 nm, and 3 nm–50 nm, respectively.

Each of the lower and upper electrodes 40 and 44 may be a single material layer, for example, a single metal layer, such as a platinum (Pt) layer or an iridium (Ir) layer, or a single conductive oxide layer, such as an iridium oxide layer (IrO$_2$) or a ruthenium oxide layer (RuO$_2$).

Alternately, the lower and upper electrodes 40 and 44 may have a multi-layer structure including a metal layer and a conductive oxide layer. For example, the lower and upper electrodes 40 and 44 may be formed by sequentially stacking an iridium (Ir) layer and an iridium conductive oxide layer (IrO$_2$).

Although not shown throughout figures, an interlayer such as a platinum (Pt) layer can exist between the lower electrode 40 and the first dielectric film 42a, between the upper electrode 44 and the third dielectric film 42c, or between both.

SECOND EMBODIMENT

A ferroelectric capacitor according to the second embodiment of the present invention is characterized by a dielectric layer formed of two ferroelectric films. The elements which have already been mentioned in connection with the first embodiment of the present invention are designated by the reference numerals used in the first embodiment of the present invention and a description thereof will not be repeated.

Figure 4:
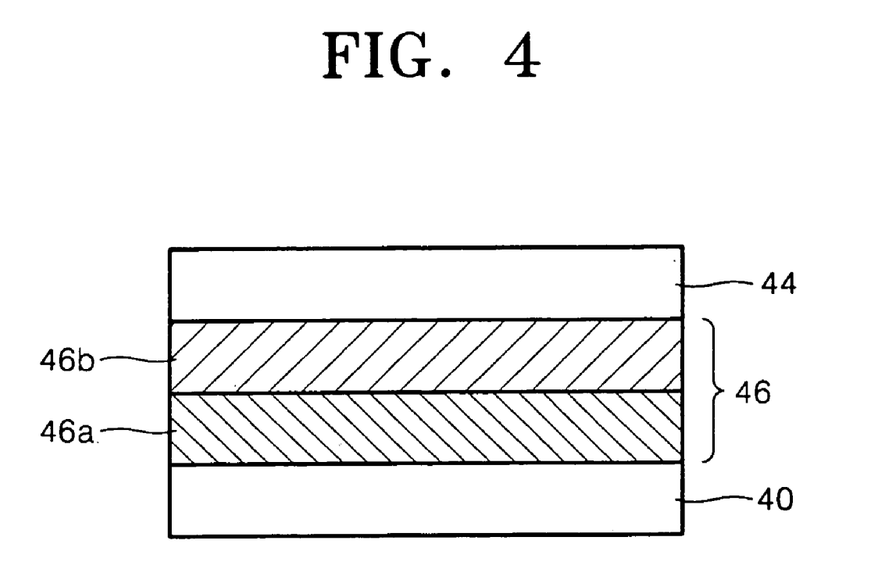
FIG. 4 illustrates a cross-sectional diagram of the structure of a ferroelectric capacitor according to a second embodiment of the present invention.

Referring to FIG. 4, the ferroelectric capacitor according to the second embodiment of the present invention includes a lower electrode 40, a dielectric layer 46, and an upper electrode 44. The dielectric layer 46 is formed by sequentially stacking a first dielectric film 46a and a second dielectric film 46b on the lower electrode 40. The first and the second dielectric films 46a and 46b are ferroelectric films having either different compositions or having the same compositions but different composition ratios. In the former configuration, the first dielectric film 46a may be a PZT film, and the second dielectric film 46b may be a PLZT film, or vice versa. In the latter configuration, the first and the second dielectric films 46a and 46b may both be a PZT or PLZT film but having different composition ratios. Here, the first and second dielectric films 46a and 46b have a thickness of 3 nm–50 nm and 30 nm–150 nm, respectively.

An interlayer such as a platinum (Pt) layer can exist between the lower electrode 40 and the first dielectric film 46a, between the upper electrode 44 and the second dielectric film 46b, or between both.

Characteristics of a ferroelectric capacitor according to an embodiment of the present invention (hereinafter, referred to as the first ferroelectric capacitor) have been measured and characteristics of conventional capacitors (hereinafter, referred to as a second ferroelectric capacitors) have been measured for comparison.

One type of first ferroelectric capacitor and three types of second ferroelectric capacitors were used for the measurement. Compositions of the first and the second ferroelectric capacitors are shown in the following Table.

Samples 1, 2, and 4 represent the three types of second ferroelectric capacitors. Sample 3 represents the one type of first ferroelectric capacitor. The order of the upper electrode, the dielectric layer, and the lower electrode proceeds from left to right in the composition column of the Table.

TABLE

| Sample | Composition |
|---|---|
| Sample 1 | Pt/PZT/Pt |
| Sample 2 | Ir/IrO$_2$/PZT/Pt/IrO$_2$ |
| Sample 3 | Ir/IrO$_2$/PLZT (0.1% La)/PZT (40/60)/PLZT (0.1% La)/Pt/IrO$_2$ |
| Sample 4 | Ir/IrO$_2$/PLZT/Pt/IrO$_2$ (0.1% La) |

In the Table, 0.1% La represents the ratio of lanthanum (La) in the PLZT film as being 0.1%, and PZT (40/60) represents a Zr/Ti ratio in the PLZT film.

Polarization characteristics, fatigue characteristics, and non-volatile remnant polarization characteristics of the first and second ferroelectric capacitors were measured.

Figure 5:
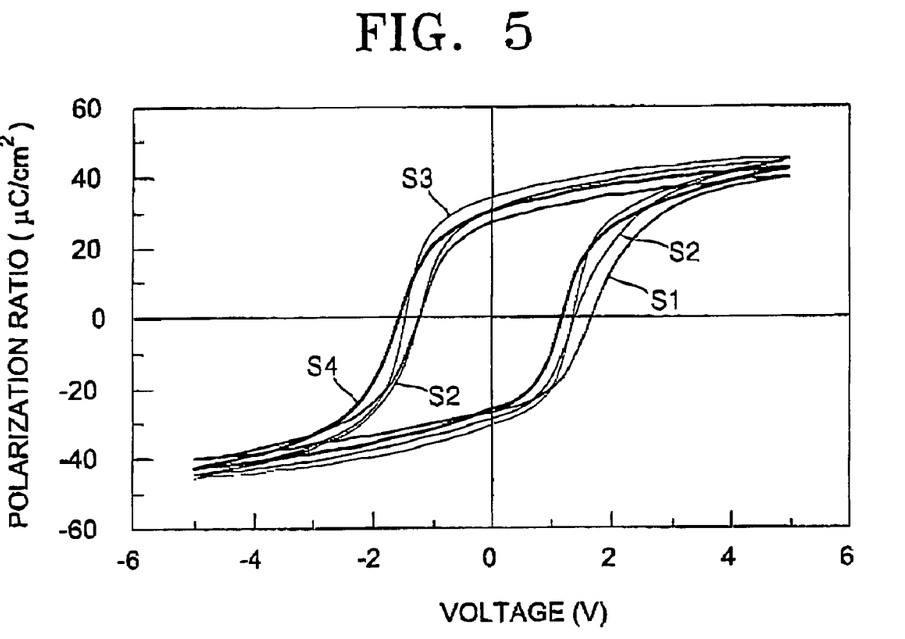
FIG. 5 is a graph showing measured results comparing polarization characteristics of conventional ferroelectric capacitors and a ferroelectric capacitor according to an embodiment of the present invention.
Figure 6:
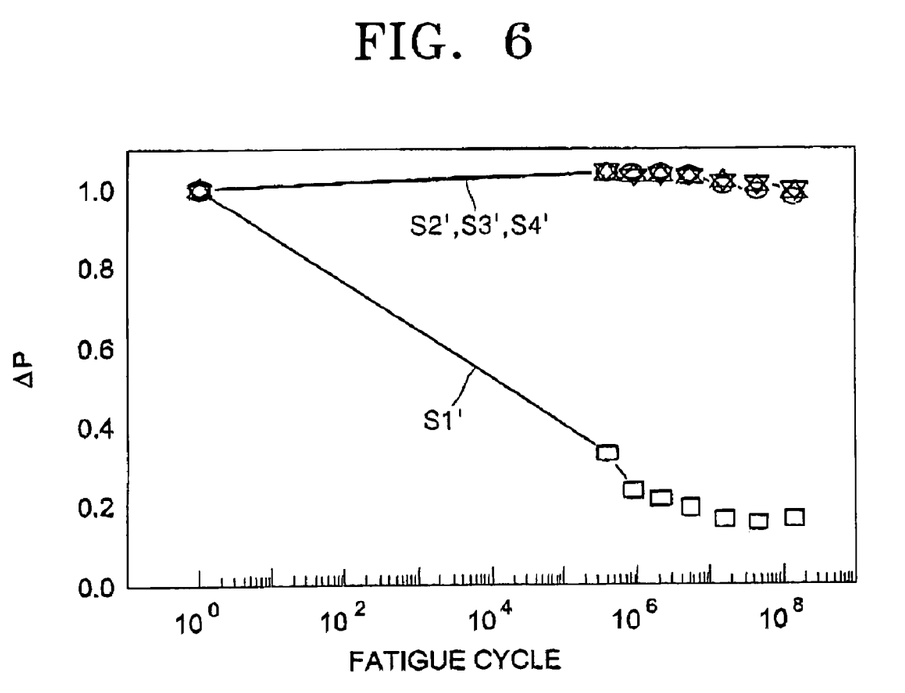
FIG. 6 is a graph showing measured results comparing fatigue characteristics of conventional ferroelectric capacitors and a ferroelectric capacitor according to an embodiment of the present invention.
Figure 7:
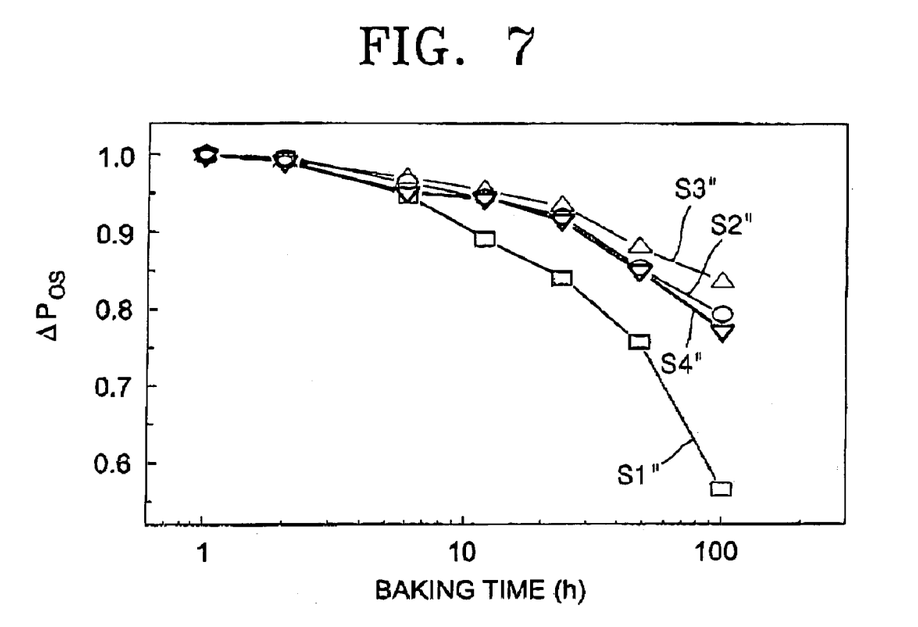
FIG. 7 is a graph showing measured results comparing non-volatile remnant polarization characteristics of conventional ferroelectric capacitors and a ferroelectric capacitor according to an embodiment of the present invention.

FIGS. 5 through 7 are graphs showing the measured results. FIG. 5 compares polarization characteristics. FIG. 6 compares fatigue characteristics. FIG. 7 compares non-volatile remnant polarization characteristics, i.e., retention characteristics.

In FIG. 5, reference numerals S1 through S4 represent the first through fourth hysteresis curves of polarization rates of samples 1 through 4, respectively.

Referring to the first through fourth hysteresis curves of polarization rates S1 through S4, the hysteresis of the first ferroelectric capacitor shown in the third hysteresis curve of polarization rate S3 is equivalent to those of the three types of second ferroelectric capacitors shown in the first, second, and fourth hysteresis curves of polarization rates S1, S2, and S4. This result signifies that the polarization characteristic of the first ferroelectric capacitor according to an embodiment of the present invention, including a dielectric layer formed by sequentially stacking at least two different ferroelectric films, is sufficiently similar to the polarization characteristic of the conventional ferroelectric capacitor that includes a dielectric layer formed of a single ferroelectric film.

In FIG. 6, reference symbols S1' through S4' represent the first through fourth fatigue characteristics curves of samples 1 through 4, respectively.

Referring to the first through fourth fatigue characteristics curves S1' through S4', for sample 1, the fatigue cycle S1' is inversely proportional to the polarization difference ΔP. For samples 2 through 4, S2', S3', and S4', respectively, however, the polarization difference ΔP shows only a small change with an increase in the fatigue cycle. This result signifies that the fatigue characteristic of the first ferroelectric capacitor (sample 3) is as superior as the fatigue characteristic of the second ferroelectric capacitors (samples 2 and 4), which include a conductive oxide layer as the upper and lower electrodes and a platinum (Pt) film between the lower electrode and the dielectric layer formed of the single ferroelectric film.

In FIG. 7, reference symbols S1", S2", S3", and S4" represent the first through fourth retention curves showing non-volatile remnant polarization characteristics of samples 1 through 4, respectively.

The first through fourth retention curves, S1" through S4", are obtained using the following procedure. Since the same procedure is applied to samples 1 through 4, sample 3, i.e., the first ferroelectric capacitor will be used as an example to explain the procedure.

Before explaining the procedure, the definition of the retention characteristics and the measurement method thereof will be described. The measurement of the retention characteristics is used to test whether stored data is damaged after data has been stored to a ferroelectric capacitor and a predetermined amount of time has passed.

The data stored in the ferroelectric capacitor is generally represented by the amount of electrical charge that is generated when the polarization direction of the ferroelectric switches. The difference between the amounts of electrical charge generated when a predetermined voltage is applied to in a predetermined direction for the polarization states ("0" or "1"), the directions of which are reverse to one another has to be large enough to be sensed by a sense amplifier of a circuit. The polarization directions of the ferroelectric layers is aligned by applying a negative or positive voltage to the ferroelectric capacitor such that the polarization state of the ferroelectric layer is a "0" or "1" state. After a predetermined amount of time has passed, the polarization states of the ferroelectric layer is reversed by applying a predetermined voltage. Then, the reversed polarization state is read. Such a procedure is referred to as an opposite-state retention evaluation. The opposite-state retention characteristics can be indicated by a non-volatile polarization rate or an opposite-state polarization rate. The opposite-state polarization rate is defined as follows.

In a first step, a first voltage is applied to the first ferroelectric capacitor to write data "0." That is, the ferroelectric film of the first ferroelectric capacitor becomes a predetermined polarization state. In a second step, the first ferroelectric capacitor to which the data "0" is written is baked for a predetermined amount of time. In a third step, a second voltage, which is of the same magnitude as the amount of the first voltage but has a polarity opposite to that of the first voltage, is applied to the baked first ferroelectric capacitor such that the written data "0" is changed to data "1," that is, the polarization state of the first ferroelectric capacitor is changed to the opposite polarization state. In a fourth step, the changed polarization state of the first ferroelectric capacitor is maintained for a predetermined amount of time. In a fifth step, the first voltage is applied to the first ferroelectric capacitor again such that the written data "1" is changed to data "0," that is, the polarization state of the ferroelectric film of the first ferroelectric capacitor is again changed. Here, a polarization rate, which is measured when the data "0" which is finally written in the first ferroelectric capacitor is read, is represented by $P^*_{OS}$ (hereinafter, referred to as a first opposite-state polarization rate).

In the first step, the second voltage is applied to the first ferroelectric capacitor, and thus data "1" is written in the first ferroelectric capacitor. Then, the second step is performed. In the third step, the first voltage is applied to the first ferroelectric capacitor, such that the data "1" written in the first ferroelectric capacitor is change to data "0," and thus the changed polarization state "0" is written in the first ferroelectric capacitor. Then, the four and the fifth steps are performed. Here, a polarization rate, which is measured when data "0," which is finally written in the first ferroelectric capacitor is read, is represented by $P^\wedge_{OS}$ (hereinafter, referred to as a second opposite-state polarization rate).

The third retention curve S3" of the first ferroelectric capacitors, that is, sample 3, is obtained from the difference $\Delta P_{OS}$ between the first and the second opposite-state polarization rates as shown in Equation 1.

$$\Delta P_{OS} = P^*_{OS} - P^\wedge_{OS} \quad (1)$$

Preferably, the difference $\Delta P_{OS}$ is greater than 0. The retention characteristics are better for higher values of the difference $\Delta P_{OS}$. Superior retention characteristics means that it is possible to accurately read data written in a ferroelectric capacitor even after long time has passed (e.g., more than ten years).

In order to accurately estimate the retention characteristics of the ferroelectric capacitor, it is preferable to write a predetermined data to the ferroelectric capacitor and read the data from the ferroelectric capacitor after ten years or more. However, it is difficult to wait for such a long time to read the data. For this reason, in general, the retention characteristics of a ferroelectric capacitor is processed under a condition capable of giving an effect that is equivalent to a long passage of time to the ferroelectric capacitor.

Thus, the first ferroelectric capacitor is baked in the second step for the purpose of simulating these conditions. Here, the first and the second ferroelectric capacitors are baked at about 125° C. for 1–100 hours in the second step. Then, the changed polarization state of the first ferroelectric capacitor is maintained for 30 seconds in the fourth step. The baking time may change with respect to the baking temperature.

Figure 8:
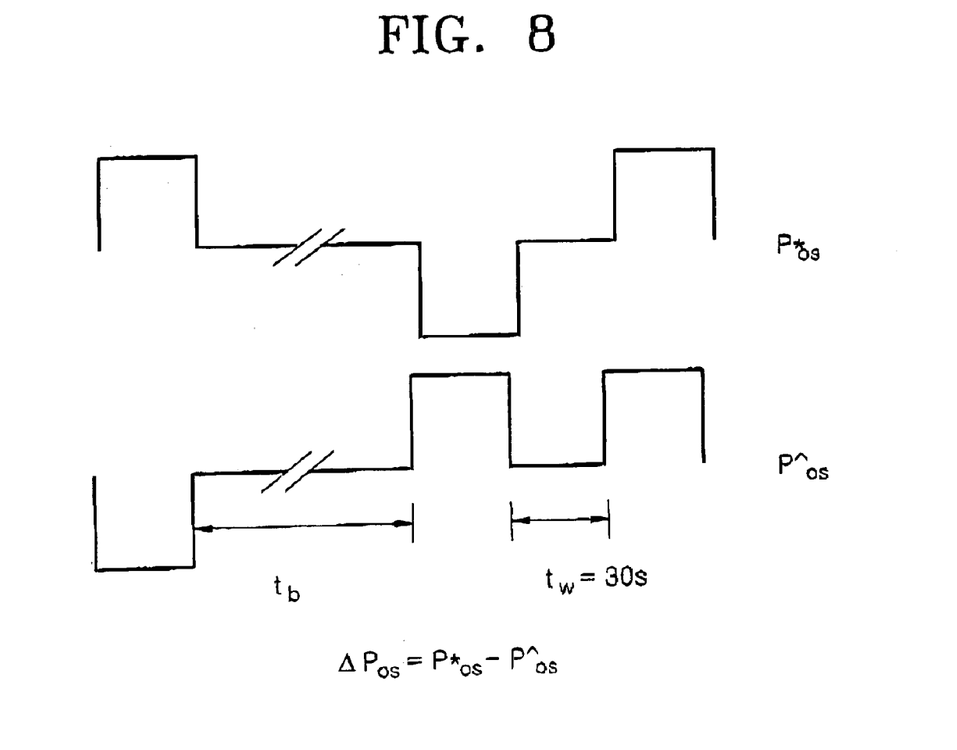
FIG. 8 is a timing diagram for explaining a pulse sequence used to measure the non-volatile polarization characteristics of FIG. 7.

FIG. 8 is a timing diagram for the first through fifth steps, where reference symbols $t_b$ and $t_w$ denote the baking time in the second step and the maintenance time in the fourth step, respectively.

Referring to the first through fourth retention curves S11", S2", S3", and S4" in FIG. 7, the differences $\Delta P_{OS}$ in samples 1 through 4 are greater than zero (0). In addition, as the baking time $t_b$ increases, the differences $\Delta P_{OS}$ decrease. The degree to which the difference $\Delta P_{OS}$ decreases is smaller in sample 3 than in samples 1, 2, and 4. Accordingly, the difference $\Delta P_{OS}$ in sample 3 is the greatest. Thus, the retention characteristics of sample 3, representing a ferroelectric capacitor of the present invention, is the most superior.

Hereinafter, a method for manufacturing ferroelectric capacitor according to an embodiment of the present invention will be described.

Figure 9:
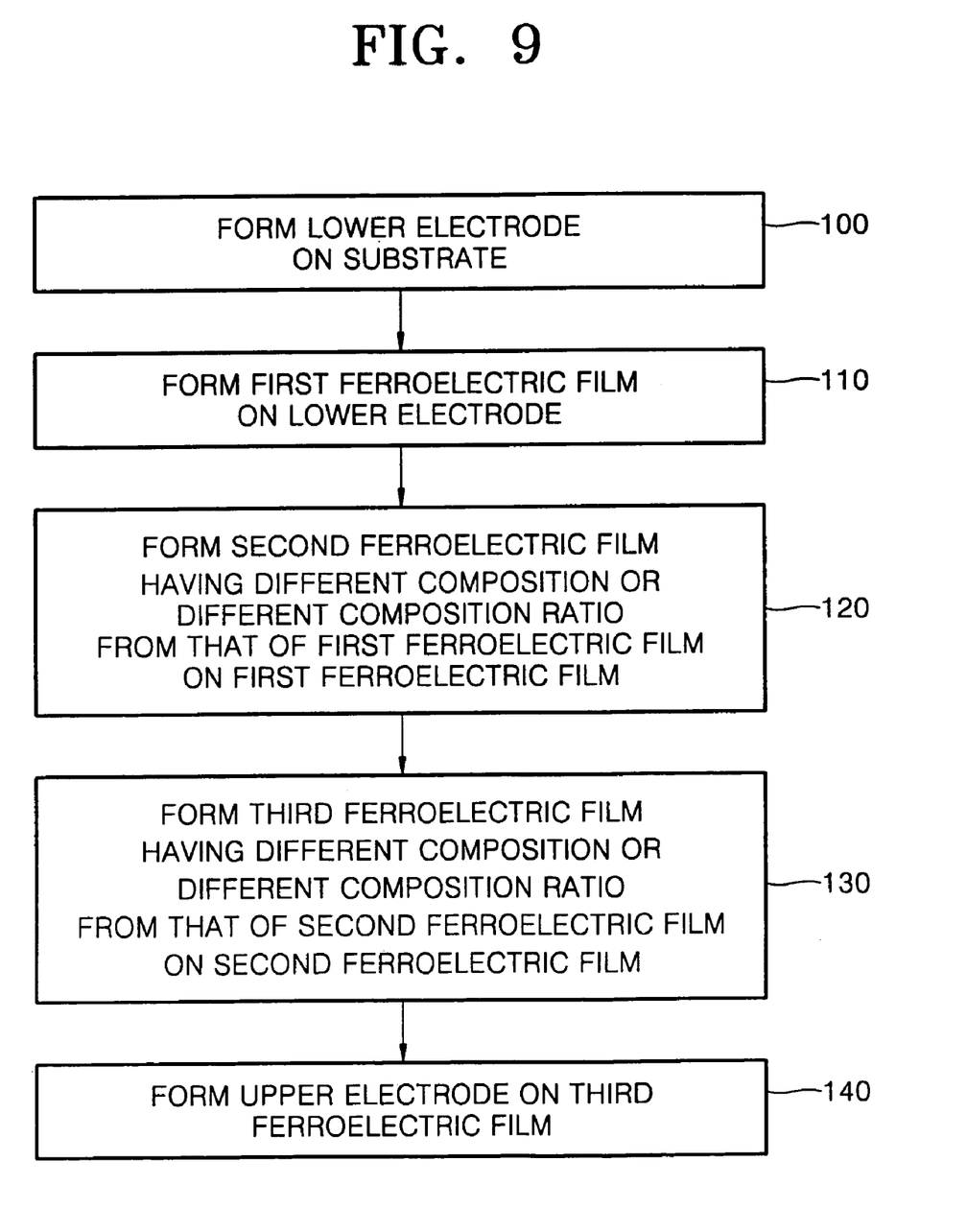
FIG. 9 is a flowchart showing a method for manufacturing a ferroelectric capacitor according to an embodiment of the present invention.

Specifically, referring to FIGS. 3 and 9, in step 100, the lower electrode 40 is formed on a substrate (not shown). Here, the substrate is formed of a conductive material layer contacting an entire surface of a conductive plug (not shown) that is connected to a predetermined region of a transistor (not shown) formed under a ferroelectric capacitor. The lower electrode 40 is formed of a conductive oxide layer, e.g., an iridium oxide layer or a ruthenium oxide layer ($RuO_2$).

Steps 110, 120, and 130 relate to forming the dielectric layer 42 that includes the first through third ferroelectric films 42a, 42b, and 42c having either different compositions or different composition ratios on the lower electrode 40.

The dielectric layer 42 may be formed according to one of the following two methods.

In a first method, the first through third ferroelectric films 42a, 42b, and 42c are formed of ferroelectric films having the same composition, e.g., PZT films, PLZT films, or BSO-PZT films, but a different composition ratio.

Specifically, the first ferroelectric film 42a is formed using one of a CSD method and a CVD method, such as a metal organic chemical vapor deposition (MOCVD). The second ferroelectric film 42a is formed on the first ferroelectric film 42a using a different method from that of the first ferroelectric film 42a. For example, if the first ferroelectric film 42a is formed using the CSD method, the second ferroelectric film 42b is formed using the MOCVD method or a combined method of the CSD and the MOCVD. Then, the third ferroelectric film 42c is formed on the second ferroelectric film 42b. Here, the third ferroelectric film 42c is formed using the CSD method or another deposition method other than the MOCVD method.

In a second method, two adjacent ferroelectric films, for example, the first and the second ferroelectric films 42a and 42b or the second and the third ferroelectric films 42b and 42c may be formed of ferroelectric films having different compositions.

Specifically, the first dielectric film 42a is formed on the lower electrode 40 using the CSD method or the MOCVD method. The first ferroelectric film 42a may be a PZT film, a PLZT film, or a BSO-PZT film. Then, the second ferroelectric film 42b is formed on the first ferroelectric film 42a using the same formation process as that of the first ferroelectric film 42a. Preferably, the first and the second ferroelectric films 42a and 42b have different compositions. For example, if the first ferroelectric film 42a is formed of a PZT film, the second ferroelectric film 42b is formed of a PLZT film. The third ferroelectric film 42c is formed on the second ferroelectric film 42b using the same formation process as that of the first ferroelectric film 42a. Preferably, the second and the third ferroelectric films 42b and 42c have different compositions. For example, if the second ferroelectric film 42b is formed of the PLZT film, the third ferroelectric film 42c is formed of a PZT film or another film other than a PLZT film.

In the two methods to form the first through third ferroelectric films 42a, 42b, and 42c, each ferroelectric film is formed at a temperature of 300–450° C. The first ferroelectric film 42a is formed to a thickness of 3 nm–50 nm. The second ferroelectric film 42b is formed to a thickness of 30 nm–150 nm. The third ferroelectric film 42c is formed to a thickness of 3 nm–50 nm.

The dielectric layer 42 may also be formed using a combination of the first and second methods. For example, the first and the second ferroelectric films 42a and 42b are formed of ferroelectric films such as PZT films having the same composition using different formation processes, according to the first method. The third dielectric film 42c may then be formed of a ferroelectric film such as a PLZT film including lanthanum (La) of 0.1% having a different composition from that of the second ferroelectric film 42b using the same formation process as that of the second ferroelectric film 42b, according to the second method.

As described above, a trap site for preventing a movement of defects is created in the ferroelectric films by forming the dielectric layer 42 of the ferroelectric films that have either different compositions or different composition ratios, and thus the retention characteristics of the ferroelectric capacitor can be improved.

Before the dielectric layer 42 is formed, an interlayer (not shown) may be formed on the lower electrode 40. Preferably, the interlayer is formed of a material film capable of facilitating the formation of the first ferroelectric film 42a. Thus, it is preferable that the interlayer is formed of a platinum (Pt) layer when the first ferroelectric film 42a is formed of a PZT film or a PLZT film.

In step 140, the upper electrode 44 is formed on the third ferroelectric film 42c. Specifically, a conductive oxide layer, e.g., an iridium oxide layer ($IrO_2$) or a ruthenium oxide layer ($RuO_2$), is formed on the third ferroelectric film 42c. Subsequently, a metal layer, such as an iridium (Ir) layer or a ruthenium (Ru) layer, is formed on the conductive oxide layer.

Preferably, the upper electrode 44 is formed of a multi-layer structure including a conductive oxide layer, but it may be also a single layer such as a conductive oxide layer or a metal layer.

After the upper electrode 44 is formed, the resultant structure is annealed at a temperature that is higher than the temperature for the formations of the first through third ferroelectric films 42a, 42b, and 42c, for example, at a temperature of 450–650° C.

After that, a ferroelectric capacitor is completed by patterning the lower electrode 40, the dielectric layer 42, and the upper electrode 44, which are sequentially stacked on the substrate. The annealing of the resultant structure may be performed after the ferroelectric capacitor is formed.

As described above, since the dielectric layer of the ferroelectric capacitor of the present invention is formed by stacking at least two heterogeneous ferroelectric films having either different compositions or different composition ratios, it is possible to prevent the movement of defects in the ferroelectric films. Accordingly, electric fields induced in the ferroelectric films are greatly weakened, thereby making it possible to hold stable polarization states of ferroelectric domains for a long retention time. Thus, it is possible to accurately read data written in the ferroelectric capacitor a long time ago. In addition, this means that the reliability of the FRAM for which the ferroelectric capacitor of an embodiment of the present invention is used is higher than that of a conventional FRAM.

Preferred embodiments of the present invention have been disclosed herein and, although specific terms are employed, they are used and are to be interpreted in a generic and descriptive sense only and not for purpose of limitation. For example, it will be understood by those of ordinary skill in the art that the dielectric layer 42 may be formed of more than three ferroelectric films using the first or the second method. Similarly, part of the dielectric layer 42 may be formed according to a conventional method, and the rest of the dielectric layer 42 may be formed according to the method of an embodiment of the present invention. Accordingly, it will be understood by those of ordinary skill in the art that various changes in form and details may be made without departing from the spirit and scope of the present invention as set forth in the following claims.

What is claimed is:

1. A ferroelectric capacitor, comprising:
a lower electrode, a dielectric layer, and an upper electrode layer, which are sequentially stacked,
wherein the dielectric layer has a multi-layer structure including a plurality of sequentially stacked ferroelectric films, wherein two adjacent ferroelectric films have either different compositions or different composition ratios, and wherein at least one ferroelectric film is a BSO-PZT film.

2. The ferroelectric capacitor as claimed in claim 1, wherein the ferroelectric capacitor further comprises:
an interlayer disposed in a position selected from the group consisting of between the lower electrode and the dielectric layer, between the upper electrode and the dielectric layer, and both between the lower electrode and the dielectric layer and the upper electrode and the dielectric layer.

3. The ferroelectric capacitor as claimed in claim 2, wherein the interlayer is a platinum (Pt) layer.

4. The ferroelectric capacitor as claimed in claim 2, wherein the dielectric layer is sequentially stacked first and second ferroelectric films.

5. The ferroelectric capacitor as claimed in claim 4, wherein the dielectric layer further comprises a third ferroelectric film sequentially stacked on the first and second ferroelectric films.

6. The ferroelectric capacitor as claimed in claim 5, wherein the first through third ferroelectric films have a thickness of 3 nm–50 nm, 30 nm–150 nm, and 3 nm–50 nm, respectively.

7. The ferroelectric capacitor as claimed in claim 5, wherein each of the first through third ferroelectric films are formed of a material selected from the group consisting of a PZT film, a PLZT ($Pb_{1-z}La_zZr_xTi_{1-x}O_3$) film, and a BSO-PZT film, and wherein adjacent ferroelectric films are formed of a different material.

8. The ferroelectric capacitor as claimed in claim 5, wherein each of the first through third ferroelectric films are formed of a material selected from the group consisting of a PZT film, a PLZT ($Pb_{1-z}La_zZr_xTi_{1-x}O_3$) film, and a BSO-PZT film, and wherein adjacent ferroelectric films are formed of the same material but have different composition ratios.

9. The ferroelectric capacitor as claimed in claim 4, wherein the first and second ferroelectric films have a thickness of 3 nm–50 nm and 30 nm–150 nm, respectively.

10. The ferroelectric capacitor as claimed in claim 4, wherein each of the first and second ferroelectric films are formed of a material selected from the group consisting of a PZT film, a PLZT ($Pb_{1-z}La_zZr_xTi_{1-x}O_3$) film, and a BSO-PZT film, and wherein the first and second ferroelectric films are formed of a different material.

11. The ferroelectric capacitor as claimed in claim 4, wherein each of the first and second ferroelectric films are formed of a material selected from the group consisting of a PZT film, a PLZT ($Pb_{1-z}La_zZr_xTi_{1-x}O_3$) film, and a BSO-PZT film, and wherein the first and second ferroelectric films are formed of the same material but have different composition ratios.

12. The ferroelectric capacitor as claimed in claim 1, wherein the dielectric layer is sequentially stacked first and second ferroelectric films.

13. The ferroelectric capacitor as claimed in claim 12, wherein the dielectric layer further comprises a third ferroelectric film sequentially stacked on the first and second ferroelectric films.

14. The ferroelectric capacitor as claimed in claim 13, wherein the first through third ferroelectric films have a thickness of 3 nm–50 nm, 30 nm–150 nm, and 3 nm–50 nm, respectively.

15. The ferroelectric capacitor as claimed in claim 13, wherein each of the first through third ferroelectric films are formed of a material selected from the group consisting of a PZT film, a PLZT ($Pb_{1-z}La_zZr_xTi_{1-x}O_3$) film, and a BSO-PZT film, and wherein adjacent ferroelectric films are formed of a different material.

16. The ferroelectric capacitor as claimed in claim 13, wherein each of the first through third ferroelectric films are formed of a material selected from the group consisting of a PZT film, a PLZT ($Pb_{1-z}La_zZr_xTi_{1-x}O_3$) film, and a BSO-PZT film, and wherein adjacent ferroelectric films are formed of the same material but have different composition ratios.

17. The ferroelectric capacitor as claimed in claim 12, wherein the first and second ferroelectric films have a thickness of 3 nm–50 nm and 30 nm–150 nm, respectively.

18. The ferroelectric capacitor as claimed in claim 12, wherein each of the first and second ferroelectric films are formed of a material selected from the group consisting of a PZT film, a PLZT ($Pb_{1-z}La_zZr_xTi_{1-x}O_3$) film, and a BSO-PZT film, and wherein the first and second ferroelectric films are formed of a different material.

19. The ferroelectric capacitor as claimed in claim 12, wherein each of the first and second ferroelectric films are formed of a material selected from the group consisting of a PZT film, a PLZT ($Pb_{1-z}La_zZr_xTi_{1-x}O_3$) film, and a BSO-PZT film, and wherein the first and second ferroelectric films are formed of the same material but have different composition ratios.

20. The ferroelectric capacitor as claimed in claim 1, wherein the upper electrode and the lower electrode are formed of a single layer of either a metal or a conductive oxide.

21. The ferroelectric capacitor as claimed in claim 20, wherein the metal is platinum (Pt) or iridium (Ir).

22. The ferroelectric capacitor as claimed in claim 20, wherein the conductive oxide is iridium oxide ($IrO_2$) or ruthenium oxide ($RuO_2$).

23. The ferroelectric capacitor as claimed in claim 1, wherein the upper and lower electrodes are formed of a sequentially stacked metal layer and a conductive oxide layer.

24. The ferroelectric capacitor as claimed in claim 23, wherein the metal is platinum (Pt) or iridium (Ir).

25. The ferroelectric capacitor as claimed in claim 23, wherein the conductive oxide is iridium oxide ($IrO_2$) or ruthenium oxide ($RuO_2$).

* * * * *